US009165787B2

(12) United States Patent
Kang

(10) Patent No.: US 9,165,787 B2
(45) Date of Patent: Oct. 20, 2015

(54) ELECTRONIC DEVICES HAVING SEMICONDUCTOR MEMORY UNITS AND METHOD FOR FABRICATING THE SAME

(71) Applicant: SK hynix Inc., Icheon-Si (KR)

(72) Inventor: Jung-Hyun Kang, Icehon-Si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 14/201,696

(22) Filed: Mar. 7, 2014

(65) Prior Publication Data

US 2014/0269005 A1    Sep. 18, 2014

(30) Foreign Application Priority Data

Mar. 15, 2013    (KR) .......................... 10-2013-0027886

(51) Int. Cl.
*G11C 5/02* (2006.01)
*G11C 5/06* (2006.01)
*G11C 13/00* (2006.01)
*H01L 21/311* (2006.01)
*H01L 45/00* (2006.01)
*H01L 27/24* (2006.01)
*H01L 21/768* (2006.01)

(52) U.S. Cl.
CPC .... *H01L 21/31144* (2013.01); *H01L 21/76816* (2013.01); *H01L 27/2463* (2013.01); *H01L 45/06* (2013.01); *H01L 45/08* (2013.01); *H01L 45/1233* (2013.01); *H01L 45/16* (2013.01); *G11C 5/02* (2013.01); *G11C 5/025* (2013.01); *G11C 5/06* (2013.01); *G11C 13/0004* (2013.01); *G11C 13/0007* (2013.01); *G11C 2213/56* (2013.01); *G11C 2213/71* (2013.01); *G11C 2213/77* (2013.01)

(58) Field of Classification Search
CPC ..................... H01L 21/02417; G11C 2213/77; G11C 5/06; G11C 2213/52; G11C 2213/56; G11C 5/02; G11C 5/025; G11C 2213/71; G11C 13/0002; G11C 13/0007; G11C 13/0004
USPC .................. 365/148, 163, 51, 63; 438/95, 133
See application file for complete search history.

(56) References Cited

U.S. PATENT DOCUMENTS

2011/0140069 A1* 6/2011 Inoue ................................. 257/5
2012/0228574 A1* 9/2012 Park et al. ......................... 257/2
2014/0183434 A1* 7/2014 Lim et al. .......................... 257/4

FOREIGN PATENT DOCUMENTS

KR    10-2010-0134418 A    12/2010
KR    10-2011-0001593 A     1/2011
KR       10-1218097 B1    12/2012
KR    10-2013-0089120 A     8/2013

* cited by examiner

*Primary Examiner* — Ly D Pham
(74) *Attorney, Agent, or Firm* — Perkins Coie LLP

(57) ABSTRACT

The disclosed technology provides an electronic device and a fabrication method thereof. An electronic device according to an implementation of the disclosed technology may include: a first interlayer insulating layer formed over a substrate; first and second contact plugs passing through the first interlayer insulating layer to contact the substrate and alternately arranged to cross each other; a variable resistance element formed over the first interlayer insulating layer and coupled to the first contact plug; a second interlayer insulating layer formed over an entire structure including the first interlayer insulating layer; a third contact plug passing through the second interlayer insulating layer so as to be coupled to the variable resistance element, and a fourth contact plug passing through the second interlayer insulating layer so as to be contacted to the second contact plug; and conductive lines coupled to the third contact plug and the fourth contact plug, respectively.

21 Claims, 15 Drawing Sheets

ELECTRONIC DEVICES HAVING SEMICONDUCTOR MEMORY UNITS AND METHOD FOR FABRICATING THE SAME

CROSS-REFERENCE TO RELATED APPLICATIONS

The present application claims priority of Korean Patent Application No. 10-2013-0027886, entitled "SEMICONDUCTOR DEVICE AND METHOD FOR FABRICATING THE SAME, AND MICROPROCESSOR, PROCESSOR, SYSTEM, DATA STORAGE SYSTEM AND MEMORY SYSTEM INCLUDING THE SEMICONDUCTOR DEVICE," and filed on Mar. 15, 2013, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic device capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which a problem of overlap between contact plugs can be solved and a patterning margin is secured.

In one aspect, an electronic device is provided to include a semiconductor memory unit that includes: a first interlayer insulating layer formed on a substrate; first and second contact plugs passing through the first interlayer insulating layer to contact the substrate and alternately arranged to cross each other; a variable resistance element formed on the first interlayer insulating layer and coupled to the first contact plug; a second interlayer insulating layer formed on an entire structure including the first interlayer insulating layer; a third contact plug passing through the second interlayer insulating layer so as to be coupled to the variable resistance element, and a fourth contact plug passing through the second interlayer insulating layer so as to be contacted to the second contact plug; and conductive lines coupled to the third contact plug and the fourth contact plug, respectively.

In another aspect, an electronic device is provided to include a semiconductor memory unit that includes: a substrate; a first interlayer insulating layer formed over the substrate; first and second contact plugs passing through the first interlayer insulating layer and located over the substrate, the first and second contact plugs and alternately arranged to have a regular intervals from each other; a variable resistance element formed over the first interlayer insulating layer and coupled to the a first contact plug; a second interlayer insulating layer formed over an entire structure including the first interlayer insulating layer, the variable resistance element, the first contact plug and the second contact plug; a third contact plug passing through the second interlayer insulating layer so as to be coupled to the variable resistance element; a fourth contact plug passing through the second interlayer insulating layer so as to be coupled to the second contact plug; and conductive lines coupled to the third contact plug and the fourth contact plug, respectively.

In some implementations, the first and third contact plugs may be arranged to overlap each other in a vertical direction.

In some implementations, the second and fourth contact plugs may be arranged to overlap each other in a vertical direction.

In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is a part of the memory unit in the microprocessor.

In some implementations, the electronic device may further include a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is a part of the cache memory unit in the processor.

In some implementations, the electronic device may further include a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit is a part of the auxiliary memory device or the main memory device in the processing system.

In some implementations, the electronic device may further include a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit is a part of the storage device or the temporary storage device in the data storage system.

In some implementations, the electronic device may further include a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit is a part of the memory or the buffer memory in the memory system.

In another aspect, a method is provided for fabricating an electronic device having a semiconductor memory unit. This method includes: forming a first interlayer insulating layer on a substrate; simultaneously forming a first contact plug and a second contact plug, which pass through the first interlayer insulating layer to contact the substrate and are alternately arranged to cross each other; forming on the first interlayer insulating layer a variable resistance element which is coupled to the first contact plug; forming a second interlayer insulating layer on an entire structure including the first interlayer insulating layer; simultaneously forming a third contact plug and a fourth contact plug wherein the third contact plug passes through the second interlayer insulating layer so as to be coupled to the variable resistance element and the fourth contact plug passes through the second interlayer insulating layer so as to be coupled to the second contact plug; and forming, on the second interlayer insulating layer, conductive lines which are coupled to the third contact plug and the fourth contact plug, respectively.

In some implementations, the simultaneously forming of the third contact plug and the fourth contact plugs and the simultaneously forming of the first contact plug and the second contact plug are performed by using the same mask.

In some implementations, the simultaneously forming of the first contact plug and the second contact plug may include forming a first negative photoresist layer on the first interlayer insulating layer; forming a first photoresist pattern to have a line-type patterns by patterning the first negative photoresist layer through exposure and development processes; forming a second negative photoresist layer on the first interlayer insulating layer and the first photoresist pattern; forming a second photoresist pattern to have an opened diagonal island-shaped portions by patterning the second negative photoresist layer through exposure and development processes; and etching the first interlayer insulating layer using hole patterns exposed by the first and second photoresist patterns.

In some implementations, the forming of the first photoresist pattern may include exposing a portion of the first negative photoresist layer, which excludes a region in which the first and second contact plugs are to be formed, using a line-type mask; and developing the non-exposed regions of the first negative photoresist layer to remove the non-exposed regions of the first negative photoresist layer. In some implementations, the forming of the first photoresist pattern comprises: exposing a portion of the first negative photoresist layer; and developing the remaining regions of the first negative photoresist layer that are not exposed to remove the remaining regions of the first negative photoresist layer, wherein the remaining regions developed provide a space the first and second contact plugs are to be formed.

In some implementations, the forming of the second photoresist pattern may include exposing a portion of the second negative photoresist layer, which excludes a region in which the first and second contact plugs are to be formed, using the bar-type mask having open regions of a diagonal island-shaped k; and developing the non-exposed regions of the second negative photoresist layer to remove the non-exposed regions of the second negative photoresist layer. In some implementations, the forming of the second photoresist pattern may comprise: exposing a portion of the second negative photoresist layer; and developing the remaining regions of the second negative photoresist layer that are not exposed to remove the remaining regions of the second negative photoresist layer, wherein the remaining regions developed provide a space that the third and fourth contact plugs are to be formed.

In some implementations, the forming of the second photoresist pattern may include controlling an angle of the non-exposed region having the diagonal island shape is controlled such that portions thereof overlapping with the non-exposed region of the first negative photoresist layer are not located in the same line in a transverse direction. In some implementations, the forming of the second photoresist pattern may include forming the non-exposed region inclined with respect to the non-exposed region of the first negative photoresist layer to form overlapping portion with the non-exposed region of the first negative photoresist layer; and controlling an inclined angle such that the overlapping portions are not located in the same line in a transverse direction.

In some implementations, portions of the non-exposed region of the second negative photoresist layer include three portions overlapping with the non-exposed region of the first negative photoresist layer are controlled to be three portions.

In another aspect, a method is provided for fabricating an electronic device having a semiconductor memory unit. This method includes: forming a first mask pattern having a plurality of first open regions having a line-type and a plurality of first residue regions; and forming a second mask pattern having a plurality of second open regions having a bar-type and a second residue region over the first mask pattern, wherein the plurality of the first open regions are exposed by the plurality of the second open regions thereby to form a plurality of hole patterns.

In some implementations, the forming of the first photoresist pattern may include exposing a portion of the first negative photoresist layer, which excludes the plurality of the first open regions using a line-type mask; and developing the non-exposed regions of the first negative photoresist layer to remove the non-exposed regions of the first negative photoresist layer.

In some implementations, the forming of the second photoresist pattern may include exposing a portion of the second negative photoresist layer, which excludes the plurality of the second open regions using a bar-type mask; and developing the non-exposed regions of the second negative photoresist layer to remove the non-exposed regions of the second negative photoresist layer.

In some implementations, the plurality of hole patterns may be arranged in a matrix configuration and are arranged to have a regular intervals from each other.

In some implementations, the one of the second open region may overlap with at least three first open regions.

In another aspect, a method is provided for forming a mask pattern. This method includes: forming a first photoresist layer on an etch target layer over a substrate; forming first photoresist patterns in the first photoresist layer by exposing selected regions of the first photoresist layer to light and developing the first photoresist layer after the exposure; forming a second photoresist layer over the first photoresist patterns and the etch target layer; forming second photoresist patterns in the second photoresist layer by exposing selected regions of the second photoresist layer to light and developing the second photoresist layer after the exposure; and etching the etch target layer using a mask pattern collectively formed by the first and second photoresist patterns as an etch barrier to form hole patterns including first hole patterns and second hole patterns which define respective regions for forming separate contact hole.

In some implementations, the first hole patterns may define a region for a contact hole connecting a variable resistance element with a substrate and the second hole patterns define a region for a contact hole connecting the substrate with a conductive line.

In some implementations, the first photoresist layer and the second photoresist layer may include a negative photoresist.

In some implementations, the size of the non-exposed region of the second photoresist may be controlled such that the non-exposed region of the second photoresist overlaps with the first photoresist patterns.

In some implementations, the non-exposed region of the second photoresist layer may be inclined with respect to first photoresist patterns to form an overlapping portion with the first photoresist patterns and the overlapping portions are not located in the same line in the transverse direction.

In another aspect, a method is provided for fabricating an electronic device. This method includes: simultaneously forming a first and second contact holes on a substrate by using a mask; forming a variable resistance element to be coupled to the substrate through the first contact hole; simultaneously forming a third and fourth contact holes by using the mask, wherein the third contact hole is coupled to the variable resistance element and the fourth contact hole is electrically coupled to the substrate through the second contact hole; forming a first and second conductive lines that contact with the third and fourth contact holes, respectively.

In some implementations, etching height for forming contact holes is decreased as compared when the second and fourth contact holes are not formed through separate processes These and other aspects, implementations and associated advantages are described in greater detail in the drawings, the description and the claims.

DETAILED DESCRIPTION

Figure 1A:
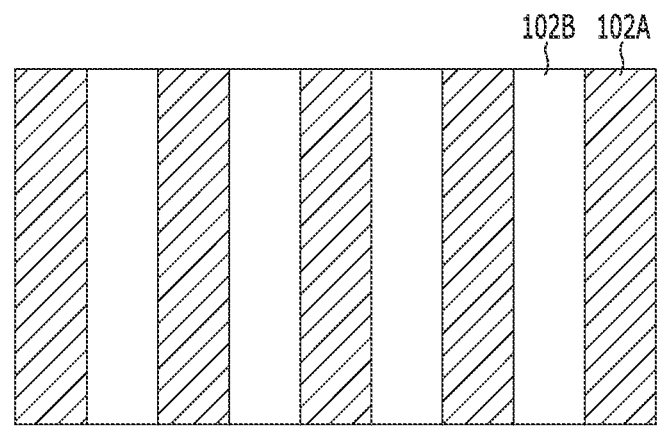
FIGS. 1A to 1E are top views showing a mask fabrication method according to an implementation of the disclosed technology.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Implementations to be described below provide a mask fabrication method capable of securing an overlap margin and reducing process difficulty in fabricating an electronic device. Generally, electronic devices including a vertical-type variable resistor element can include contact plugs, such as a contact plug which is coupled to the variable resistance element and a contact plug which is coupled directly to a substrate. Such contact plugs are formed by different processes. Specifically, a contact plug (bottom electrode contact (BEC)) that connects the substrate with the variable resistance element and a contact plug (top electrode contact (TEC)) that connects the variable resistance element with a conductive line are formed separately, followed by formation of a contact plug (source line contact (SLC)) which is arranged to come BEC and TEC and coupled directly to the substrate and the conductive line.

In the above fabrication process, there can be certain problems: a problem in achieving desired overlap between BEC and TEC, and problems resulting from etching height and a problem of short circuits with TEC. In recognition of the above problems, implementations of the disclosed technology provide a mask fabrication method in which SLC having two separate layers is formed to secure an etch margin, the simultaneous formation of BEC and first SLC and the simultaneous formation of TEC and second SLC are performed to solve a problem of short circuits between the contact plugs and secure a patterning margin, and different contact hole processes are performed using the same mask in order to solve a problem of overlap between the contact plugs.

FIGS. 1A to 1E are top views showing a mask fabrication method according to an implementation of the disclosed technology. FIGS. 2A to 2E are perspective views showing the same mask fabrication method shown in FIGS. 1A to 1E.

Figure 2A:
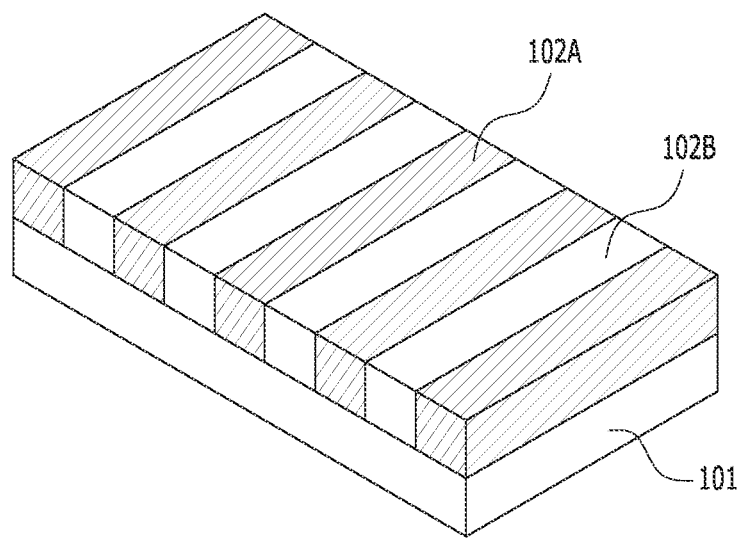
FIGS. 2A to 2E are perspective views showing a mask fabrication method according to an implementation of the disclosed technology.

As shown in FIGS. 1A and 2A, a first photoresist layer is formed on a etch target layer 101 to be etched. The first photoresist layer is exposed to a light pattern to form regions 102A and 102B. The regions 102A of the first photoresist layer are to be retained, and the regions 102B are to be removed. The etch target layer 101 to be etched may be a hard mask layer for providing a pattern formation. Alternatively, the etch target layer may be a substrate on which a pattern is formed, an insulating layer or a conductive layer.

The first photoresist layer including regions 102A and regions 102B may include a negative photoresist in the illustrated example. Different from a positive photoresist in which an exposed region is developed and is to be removed, the negative photoresist is a photoresist in which a non-exposed region is developed and is to be removed.

The first photoresist layer is exposed to light and include regions 102A that are exposed to light and are retained and non-exposed regions 102B that are not exposed to light and are removed Thus, the first photoresist layer is divided into the exposed regions 102A and the non-exposed regions 102B. The regions 102A and the regions 102B form line-type patterns.

Figure 1B:
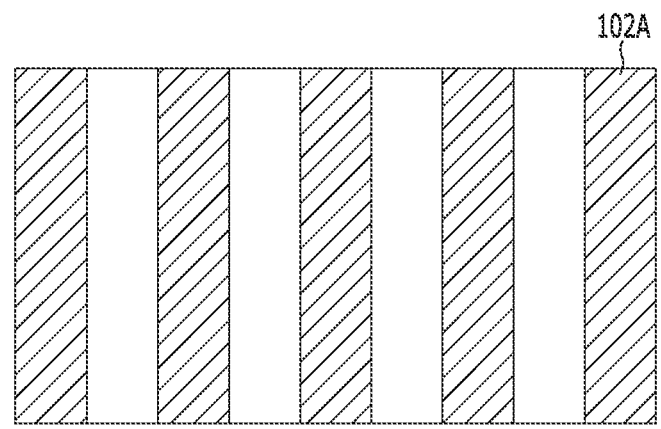
Figure 2B:
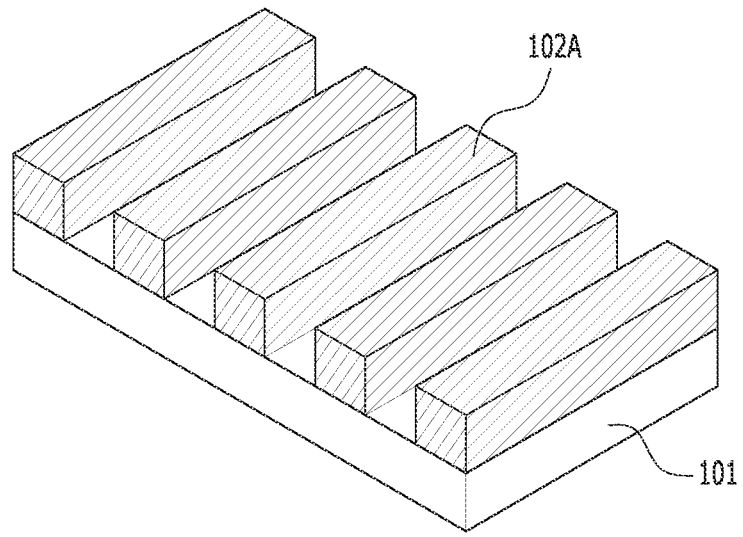

As shown in FIGS. 1B and 2B, the non-exposed regions 102B of the first photoresist layer of a negative photoresist are developed and removed while the exposed regions 102A remain to form the line-type patterns. Accordingly, first photoresist patterns are formed by the exposed regions 102A in the first photoresist layer to have a structure that lines and spaces (or grooves) are alternately arranged and repeated over the etch target layer 101.

Figure 1C:
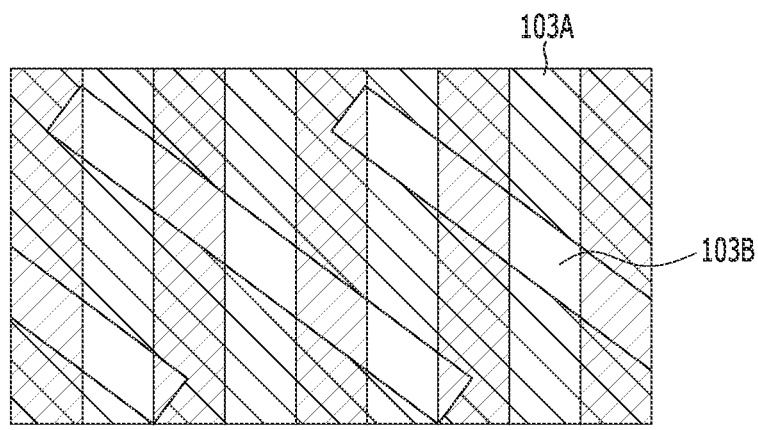
Figure 2C:
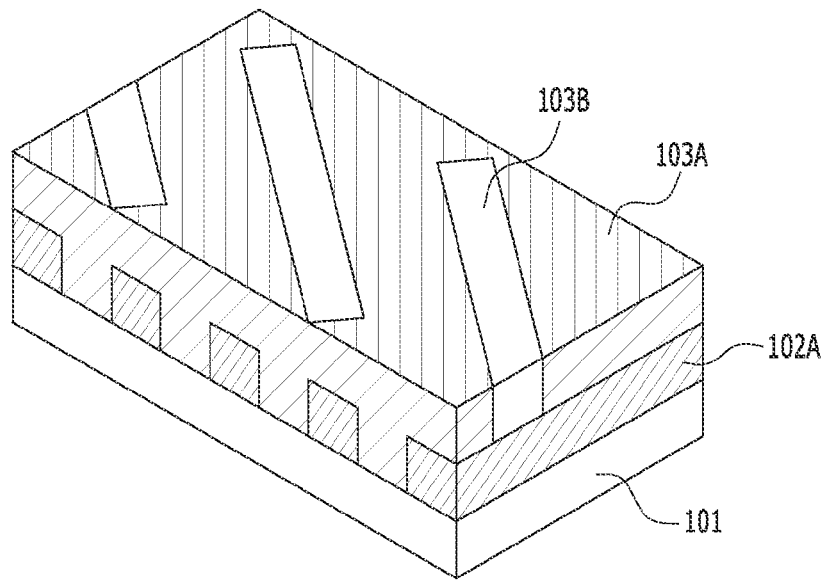

As shown in FIGS. 1C and 2C, a second photoresist layer is formed over the first photoresist patterns 102A and the etch target layer 101 and is patterned to include regions 103A and 103B. The second photoresist layer with regions 103A and 103B may include the same photoresist material as that of the first photoresist pattern 102A such as a negative photoresist. The second photoresist layer may be formed to have a thickness enough to fill the line grooves between the first photoresist patterns 102A.

Next, the second photoresist layer is exposed to light to form a desired second photoresist pattern. When made of a negative photoresist material, the second photoresist layer is exposed to a light pattern in which regions 103A are not exposed to light and are to be retained, and regions 103B are exposed to light and are to be removed. As illustrated in a specific example of FIG. 2C, each of regions 103B in the second photoresist layer has a diagonal island-shape with respect to the line-type patterns formed by regions 102A in the first photoresist layer. Herein, the exposure to light may be performed such that each region of the second photoresist layer (regions 103A) excluding the diagonal island-shaped regions 103B is exposed to light. The angle of the non-exposed region 103B of the second photoresist layer may be controlled such that the overlapping portions of the non-exposed region 103B with the first photoresist patterns 102A are not located in the same line in the transverse direction. In addition, the length or size of the non-exposed region 103B of the second photoresist layer may be controlled such that the non-exposed region 103B overlaps with the first photoresist patterns 102A. As illustrated in a specific example of FIG. 1D, the non-exposed region 103B overlaps with four first photoresist patterns 102A in the transverse direction. Further, the length or size of the non-exposed region 103B of the second photoresist layer may be controlled such that only a portion of the non-exposed region 103B overlaps with the first photoresist patterns 102A at both ends, which allows the non-exposed region 103B of the second photoresist layer overlaps with portions of the non-exposed region 102B of the first photoresist layer. As illustrated in a specific example of FIG. 1D, if the non-exposed regions 103B of the second photoresist layer has island shaped portions, one of the island shaped portions overlaps with three remote portions in the non-exposed region 102B of the first photoresist layer.

Figure 1D:
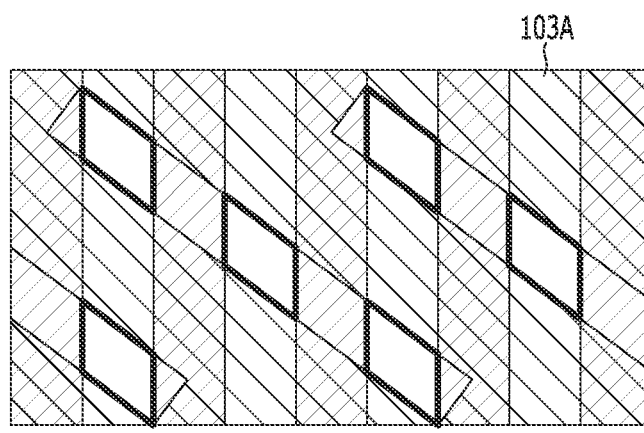
Figure 2D:
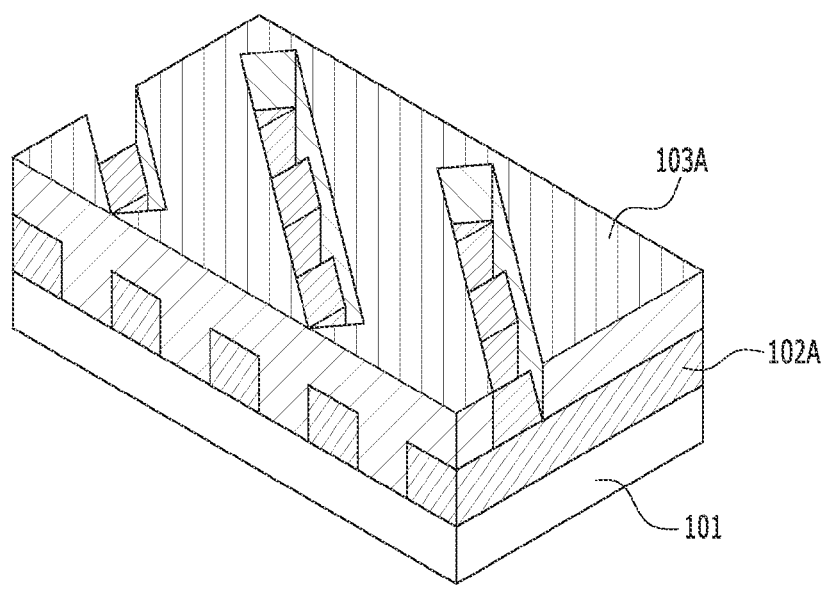

As shown in FIGS. 1D and 2D, the non-exposed region 103B of the second photoresist layer is developed. In the process of developing the non-exposed region 103B of the second photoresist layer, the exposed first photoresist patterns 102A under the non-exposed region 103B of the second photoresist layer remain without being developed, because they correspond to the exposed region during the formation of the first photoresist patterns 102A. In other words, only the non-exposed region 103B of the second photoresist layer which fills or covers a space between the first photoresist patterns 102A is removed.

Second photoresist patterns 103A are formed on the etch target layer 101 and the first photoresist patterns 102A. The second photoresist patterns 103A has a diagonal island-shaped open region through which the etch target layer 101, particularly the etch target layer 101 formed between the first photoresist patterns 102A, is exposed.

As a result, rectangular hole patterns are defined by the first photoresist patterns 102A and the second photoresist patterns 103A.

Figure 1E:
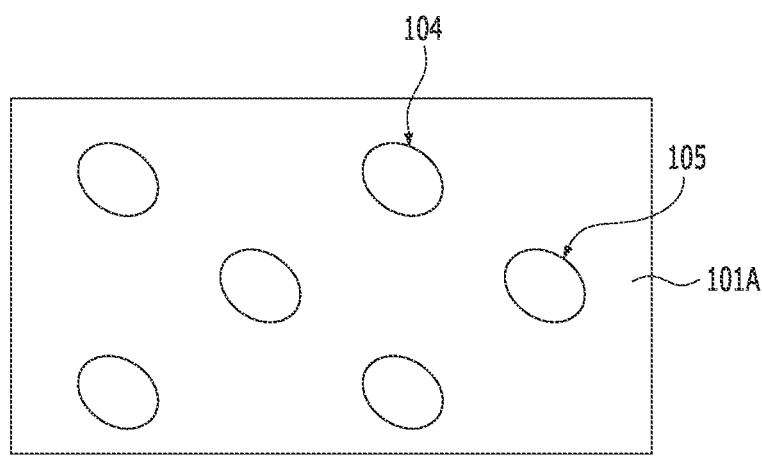
Figure 2E:
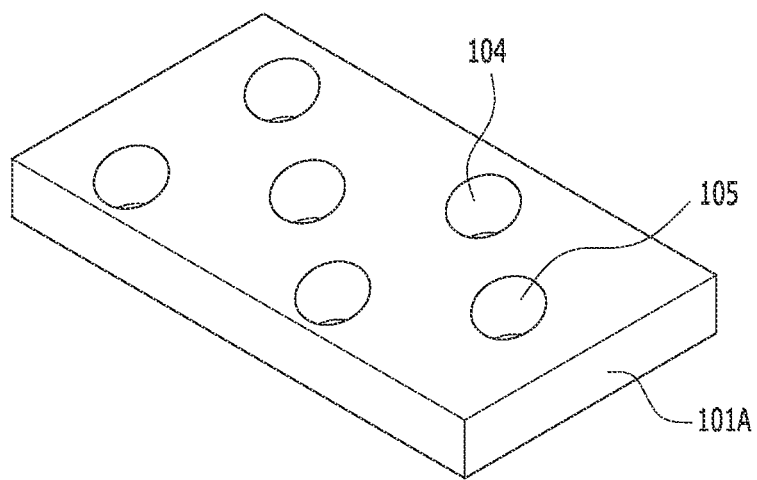

As shown in FIGS. 1E and 2E, the etch target layer 101 are to be etched using the second photoresist patterns 103A and the first photoresist patterns 102A which have the rectangular hole patterns as an etch barrier to form hole patterns 104 and 105. Reference numeral 101A designates the etch target layer having the hole patterns 104 and 105.

The hole patterns 104 and 105 can be formed in a circular shape using the mask as the corner portions become dull when the etch target layer 101 is etched. The hole patterns 104 and 105 may include first hole patterns 104 and second hole patterns 105. The first hole patterns 104 define a region where a contact plug connecting a substrate to a variable resistance element is formed. The second hole patterns 105 define a region where a contact plug coupling the substrate to a conductive line is formed. The hole patterns that are arranged in the same line in the longitudinal direction may perform the same function.

The first hole patterns 104 and the second hole patterns 105 may be alternately arranged to cross each other. The first hole patterns 104 may be arranged in a matrix configuration. The second hole patterns 105 may be arranged in a matrix configuration and between a plurality of the first hole patterns 104 so as to have a regular interval from the first hole patterns 104.

As described above, the first and second hole patterns 104 and 105 are formed by applying the negative photoresist patterning process twice during the fabrication of the mask pattern. The spacing between the first and second hole patterns 104 and 105 and the arrangement of the hole patterns can be uniformly controlled.

Figure 3:
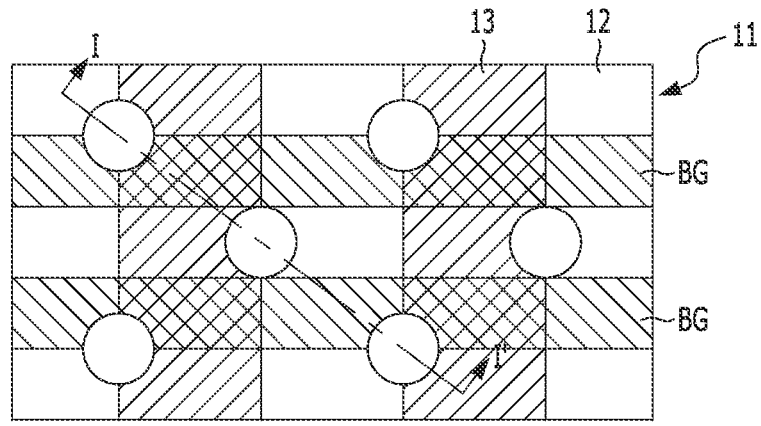
FIG. 3 is a top view showing an electronic device according to an implementation of the disclosed technology.

FIG. 3 is a top view showing an electronic device according to an implementation of the disclosed technology.

As shown in FIG. 3, an element isolation layer 12 and line type active regions 13 may be formed in a substrate 11. In addition, switching elements (having a buried gate structure and represented by buried gates BG) may be formed in a direction intersecting the active region 13. In other implementations, various changes can be made for the active regions and switching elements. The active regions 13 may further include island type active regions and the like, and the switching elements BG may include various other gate types including a recess type, a flat plate type or a vertical type.

Variable resistance elements and source line contacts may be formed on the active regions 13. The variable resistance elements and the source line contacts may be alternately arranged to cross each other, and the source line contacts may be arranged between a pair of the switching elements BG. In addition, the variable resistance elements may be arranged in a matrix configuration, and the source line contacts may be arranged such that they have a regular interval from a plurality of the variable resistance elements.

Figure 4:
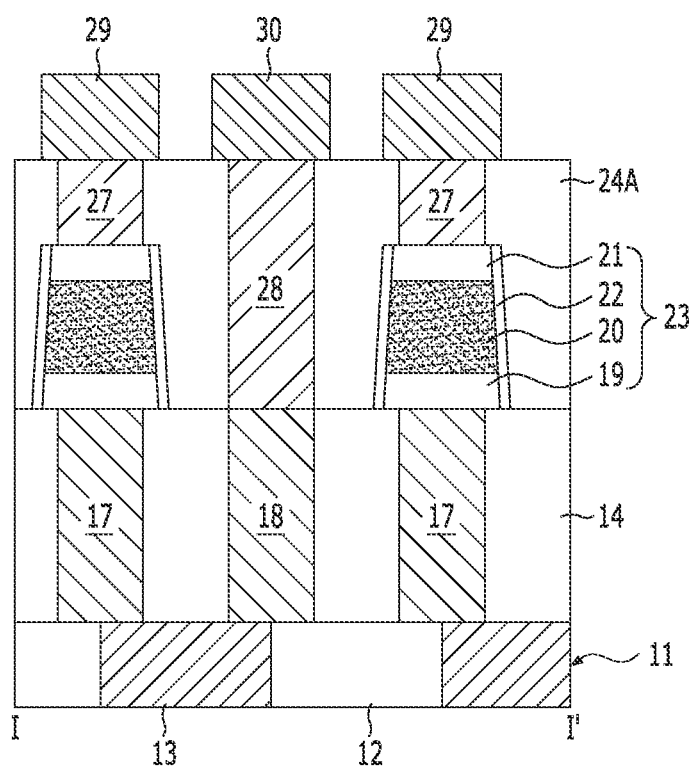
FIG. 4 is a cross-sectional view showing an electronic device according to an implementation of the disclosed technology.

FIG. 4 is a cross-sectional view showing an electronic device according to an implementation of the disclosed technology.

FIG. 4 is a cross-sectional view taken along line I-I' of FIG. 3 and will be explained using the same reference numerals as those in FIG. 3 in order to help understanding.

As shown in FIG. 4, the electronic device according to this implementation may include a substrate 11 with desired structures. For example, the desired structures may include switching elements (not shown), an element isolation layer 12 formed in the substrate 11, and active regions 13 defined by the element isolation layer 12. In addition, the electronic device may include a first interlayer insulating layer 14 formed on the substrate 11, and first and second contact plugs 17 and 18 passing through the first interlayer insulating layer 14 so as to be coupled to the substrate 11. Further, the electronic device may include variable resistance elements 23 formed on the first interlayer insulating layer 13 and coupled to the substrate 11 through the first contact plugs 17, and a second interlayer insulating layer 24A formed on the first interlayer insulating layer 14 and the variable resistance elements 23.

In addition, the electronic device may include first and second conductive lines 29 and 30 formed on the second interlayer insulating layer 24A, third contact plugs 27 formed through the second interlayer insulating layer 24A to connect the first conductive line 29 to the variable resistance elements 23, and a fifth contact plug 28 formed through the second interlayer insulating layer 24A to connect the second conductive line 30 to the second contact plug 18.

Each of the variable resistance elements 23 may include a stack structured including a first electrode 19, a variable resistance layer 20 and a second electrode 21. In addition, the variable resistance element may include a spacer 22 formed on the sidewalls of the stack structure.

The variable resistance element 23 can have the property of switching between different resistance states (or different resistance values) according to a bias (e.g., voltage or electric current) that is applied through the first electrode 19 or the second electrode 21 or the both. This property can be used in various fields. For example, the variable resistance element 23 can be used as a data storage element for storing data.

The variable resistance layer 20 in the storage device may exhibit a variable resistance characteristic in response to a bias applied through the first electrode 19 or the second electrode 21 or the both, and may include a single layer or multiple layers. For example, the variable resistance layer 20 may include a phase change material. The phase change material may include a chalcogen compound. The phase change material is changed to an amorphous state or a crystalline state in response to an external stimulus (e.g., voltage or electric current) and can have the property of switching between different resistance states. In addition, the variable resistance layer 20 may include a metal oxide. The metal oxide may include a transition metal oxide (TMO), a Perovskite-based oxide or the like. The metal oxide may include intralayer vacancies and have the property of switching between different resistance states by the production and extinction of conductive paths, which result from the behavior of the vacancies due to an external stimulus. Further, the variable resistance layer 20 may include a stack layer having a tunnel barrier layer interposed between two magnetic layers. The stack layer having the tunnel barrier layer interposed between two magnetic layers is also referred to as "magnetic tunnel junction" (MTJ). The stack layer having the tunnel barrier layer interposed between two magnetic layers can have property characteristic switched between different resistance states depending on the magnetization directions of the two magnetic layers. For example, when the magnetization directions of the two magnetic layers are the same (or parallel to each other), the stack layer can have a low-resistance state, and when the magnetization directions of the two magnetic layers are different (or semi-parallel to each other), the stack layer can have a high-resistance state. However, other implementations are also possible. The variable resistance layer 20 may be made of any material satisfying the variable resistance characteristic capable of switching between different resistance states in response to a bias that is applied to the first electrode 19 or the second electrode 21 or the both.

The first electrode 19, the second electrode 21 and the conductive lines 29 and 30 may include a metallic layer. The metallic layer means a conductive layer including a metal element and may include a metal layer, a metal oxide layer, a metal nitride layer, a metal oxynitride layer, a metal silicide layer or the like.

The first electrode 19 serves as a bottom electrode for the variable resistance element 23 and the second electrode 21 serves as a top electrode for the variable resistance element 23 and functions to protect the variable resistance element 23 and the first electrode 19 during processes.

The spacer 22 may include an insulating material. Specifically, the spacer 22 may be any single layer selected from an oxide layer, a nitride layer, and an oxynitride layer, or a stack layer of the above layers.

The switching element functions to select a specific unit cell in an electronic device comprising a plurality of unit cells, may be arranged for each unit cell and may include a transistor, a diode or the like. One end of the switching element may be electrically coupled to the first contact plug 17, and the other end may be electrically coupled to a source line, that is, the second conductive line 30, through the third contact plug 27.

The first to fourth contact plugs 17, 18, 27 and 28 may include a semiconductor layer or a metallic layer.

The first contact plug 17 may form the bottom electrode contact BEC configured to connect the substrate 11 with the variable resistance element 23, and the third contact plug 27 may form the top electrode contact TEC configured to connect the variable resistance 23 with the first conductive line 29. The second and fourth contact plugs 18 and 28 may form source line contacts SLCs configured to electrically connect the substrate 11 with the second conductive line 30, that is, a source line.

The third contact plug 27 may be formed to overlap with the first contact plug 17, and the fourth contact plug 28 may be formed to overlap with the second contact plug 18. The second and fourth contact plugs 18 and 28 may be alternately arranged to cross the variable resistance elements 23 as shown in the arrangement view of FIG. 3 such that they are not formed in the same line as the line of the variable resistance elements 23. In addition, the variable resistance elements 23 may be arranged in a matrix configuration, and the second and fourth contact plugs 18 and 28 may be arranged to have a regular interval from a plurality of the variable resistance elements 23.

As described above, the second and fourth contact plugs 18 and 28 are not formed simultaneously, but are formed separately. By doing so, the etching height required for forming the contact hole patterns in the formation of each of the contact plugs can decrease, thereby securing a process margin.

FIGS. 5A to 5G are cross-sectional views taken along line I-I' of FIG. 3 and show an example of a method for fabricating an electronic device. FIGS. 5A to 5G show an example of a fabrication method for forming the structure of FIG. 4.

Figure 5A:
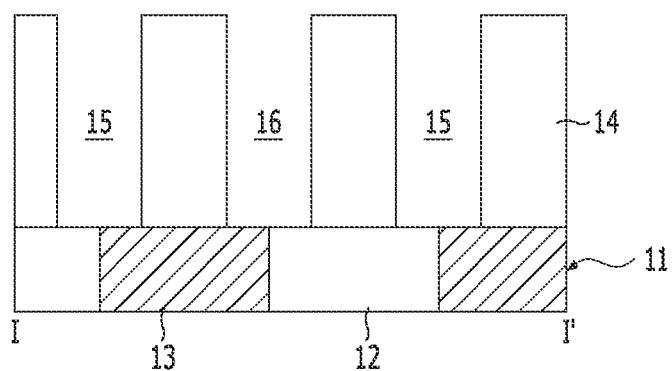
FIGS. 5A to 5G are cross-sectional views taken along line I-I' of FIG. 3 and show an example of a method for fabricating an electronic device.

As shown in FIG. 5A, a substrate 11 is provided which has desired structures including, for example, switching elements (not shown). The substrate 11 may include an element isolation layer 12 formed in the substrate, and an active region defined by the element isolation layer 12. The switching element is used to select a specific unit cell in an electronic device including a plurality of unit cells and may include a transistor, a diode or the like. One end of the switching element may be electrically coupled with a first contact plug, and the other hand may be electrically coupled with a source line through second and fourth contact plugs.

A first interlayer insulating layer 14 is formed on the substrate 11. The first interlayer insulating layer 14 may be formed of any single layer including one of an oxide layer, a nitride layer and an oxynitride layer or may be a stack layer of these layers.

First and second contact holes 15 and 16 are formed which pass through the first interlayer insulating layer 14 to expose the substrate 11. The first and second contact holes 15 and 16 can be formed simultaneously using a single mask. In forming the first and second contact holes 15 and 16, the mask fabrication method shown in FIGS. 1A to 1E and FIGS. 2A to 2E can be employed. In this case, since the first and second contact holes 15 and 16 are formed simultaneously, a mask-and-etching process does not need to be repeated, and thus a process margin can be secured. In addition, the uniform spacing between the first and second contact holes 15 and 16 can be provided by using the single mask fabrication method, it is easy to secure the spacing between the contact holes, compared to when the contact holes are formed separately, and a desired etching margin in formation of the contact holes can be ensured.

The first and second contact holes 15 and 16 may be alternately formed to cross each other by employing the techniques of the mask fabrication method disclosed in this patent document. The first contact holes 15 may be arranged in a matrix configuration, and the second contact holes 16 may be arranged to have a regular interval from a plurality of the first contact holes 15.

Figure 5B:
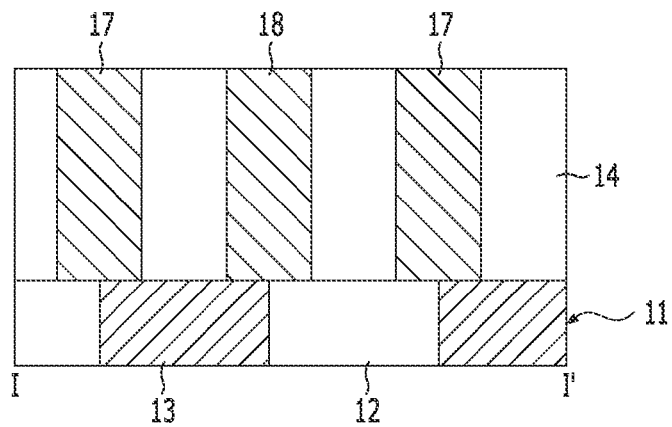

As shown in FIG. 5B, a conductive material is filled in the first and second contact holes 15 and 16 to form first and second contact holes 17 and 18. The first and second contact plugs 17 and 18 can be formed through a series of processes, including forming a conductive material on the entire surfaced so as to gap-fill the first and second contact holes 15 and 16 (see FIG. 5G), and electrically isolating between the adjacent contact plugs. The isolation process can be performed by etching or polishing the conductive material formed on the entire surface by using a blanket etching process (e.g., etch back process) or a chemical mechanical polishing until the first interlayer insulating layer 14 is exposed.

Figure 5C:
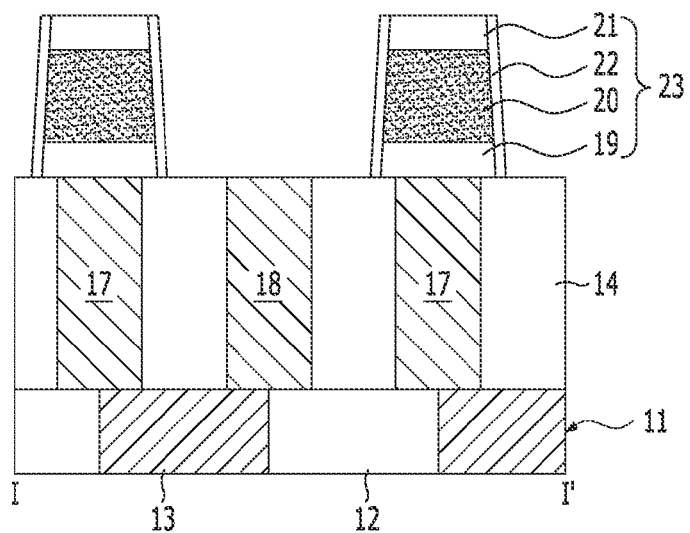

As shown in FIG. 5C, variable resistance elements 23 are formed on the first interlayer insulting layer 14 including the first and second contact plugs 17 and 18. The variable resistance elements 23 have a characteristic and structures as explained with reference to FIG. 4. The variable resistance elements 23 are coupled to the substrate 11 through the first contact plugs 17. The variable resistance element 23 may include a stack of a first electrode 19, a variable resistance layer 20 and a second electrode 21 and may include a spacer 22 formed on the sidewall of the stack.

The variable resistance element 23 can have the property of switching between different resistance states (or different resistance values) according to a bias (e.g., voltage or electric current) that is applied through the first electrode 19 and/or the second electrode 21. This property can be used in various fields. For example, the variable resistance element 23 can be used as a data storage element for storing data.

The variable resistance layer 20 shows a variable resistance property by a bias that is applied through the first electrode 19 and/or the second electrode 21, and it may include a single layer or multiple layers. For example, the variable resistance layer 20 may include a phase change material. The phase change material may include a chalcogen compound. The phase change material is changed to an amorphous state or a crystalline state by an external stimulus (e.g., voltage or electric current) and can have the property of switching between different resistance states. In addition, the variable resistance layer 20 may include a metal oxide. The metal oxide may include a transition metal oxide (TMO), a Perovskite-based oxide or the like. The metal oxide may include intralayer vacancies and have the property of switching between different resistance states by the production and extinction of conductive paths, which result from the behavior of the vacancies due to an external stimulus. Further, the variable resistance layer 20 may include a layer stack including a tunnel barrier layer interposed between two magnetic layers. The layer stack including the tunnel barrier layer interposed between two magnetic layers is also referred to as "magnetic tunnel junction" (MTJ). The layer stack having the tunnel barrier layer interposed between two magnetic layers can have the property of switching between different resistance states depending on the magnetization directions of the two magnetic layers. For example, when the magnetization directions of the two magnetic layers are the same (or parallel to each other), the layer stack can have a low-resistance state, and when the magnetization directions of the two magnetic layers are different (or semi-parallel to each other), the layer stack can have a high-resistance state. However, this implementation is not limited thereto, and the variable resistance layer 20 may be made of any material satisfying the variable resistance property capable of switching between different resistance states by a bias that is applied to the first electrode 19 and/or the second electrode 21.

The first electrode 19 and the second electrode 21 may include a metallic layer. The metallic layer means a conductive layer including a metal element and may include a metal layer, a metal oxide layer, a metal nitride layer, a metal oxynitride layer, a metal silicide layer or the like.

The first electrode 19 serves as a bottom electrode for the variable resistance element 23, and the second electrode 21 serves as a top electrode for the variable resistance element and functions to protect the variable resistance element 23 and the first electrode 19 during processes.

The spacer 22 may include an insulating material. Specifically, the spacer 22 may be any single layer selected from an oxide layer, a nitride layer and an oxynitride layer or may be a stack of these layers.

Figure 5D:
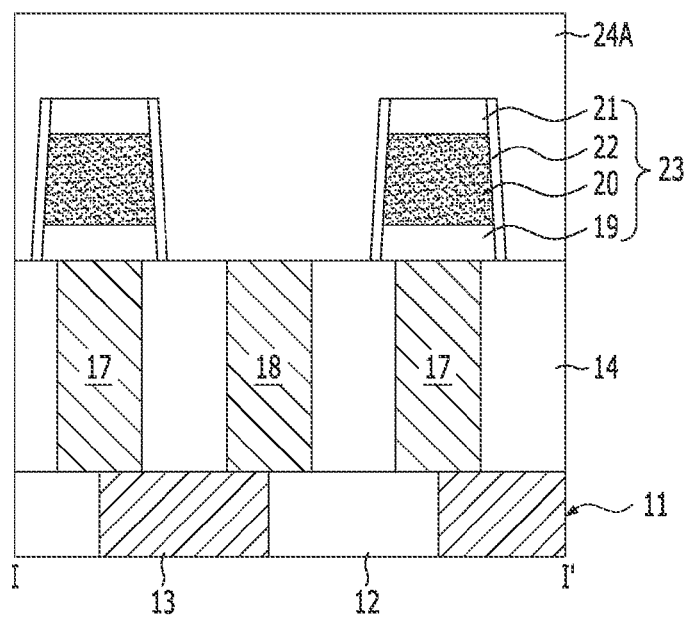

As shown in FIG. 5D, a second interlayer insulating layer 24 is formed on the first interlayer insulating layer 14 and the variable resistance elements 23. The second interlayer insulating layer 24 may be formed to have a thickness sufficiently fill or cover a space between the variable resistance elements 23. For example, the second interlayer insulating layer 24 may be formed to have a surface level higher than the upper surface of the variable resistance elements 23. The second interlayer insulating layer 24 may be formed of the same material as that of the first interlayer insulating layer 14. For example, the second interlayer insulating layer 24 may be formed of any single layer selected from an oxide layer, a nitride layer or an oxynitride layer or may be formed of a stack layer of these layers.

Figure 5E:
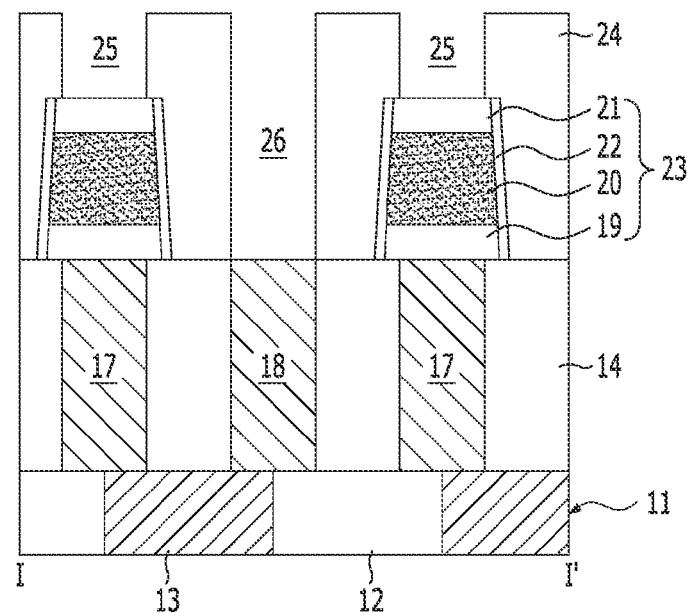

As shown in FIG. 5E, the second interlayer insulating layer 24 (see FIG. 5D) is selectively etched to form third contact holes 25 and fourth contact holes 26. The third contact holes 25 expose the top of the variable resistance elements 23 and the fourth contact holes 26 expose the second contact plugs.

The third and fourth contact holes 25 and 26 may be formed simultaneously using a single mask. In forming the third and fourth contact holes 25 and 26, the same mask may be used as that for the first and second contact holes 15 and 16. In other words, the third and fourth contact holes 25 and 26 can be formed using the mask fabrication method as explained in FIGS. 1A to 1E and FIGS. 2A to 2E.

When the third and fourth contact holes 25 and 26 are formed simultaneously, a mask-and-etching process does not need to be repeated for forming the first contact hole 25 and the second contact hole 26, and thus a process margin can be secured. In addition, the uniform spacing between the third and fourth contact holes 25 and 26 can be maintained using the mask fabrication method according to this implementation, it is easy to ensure the spacing between the contact holes, compared to when the contact holes are formed separately, and an etching margin in formation of the contact holes can be secured.

The third and fourth contact holes 25 and 26 may be alternately formed to cross each other by employing the mask fabrication method as disclosed in this patent document. The third contact holes 25 may be arranged in a matrix configuration, and the fourth contact holes 26 may be arranged to have a regular interval from a plurality of the third contact holes 15.

The third and fourth contact holes 25 and 26 are formed to overlap with the first and second contact holes 15 and 16. Since the same mask is used to form the third and fourth contact holes 25 and 26 as that for the first and second contact holes 15 and 16, the misalignment between the contact holes does not occur.

Although the depth of the fourth contact holes 26 is greater deeper than the depth of the third contact holes 25, the variable resistance elements 23 are not damaged due to the etch selectivity with regard to the second electrode 21.

Figure 5F:
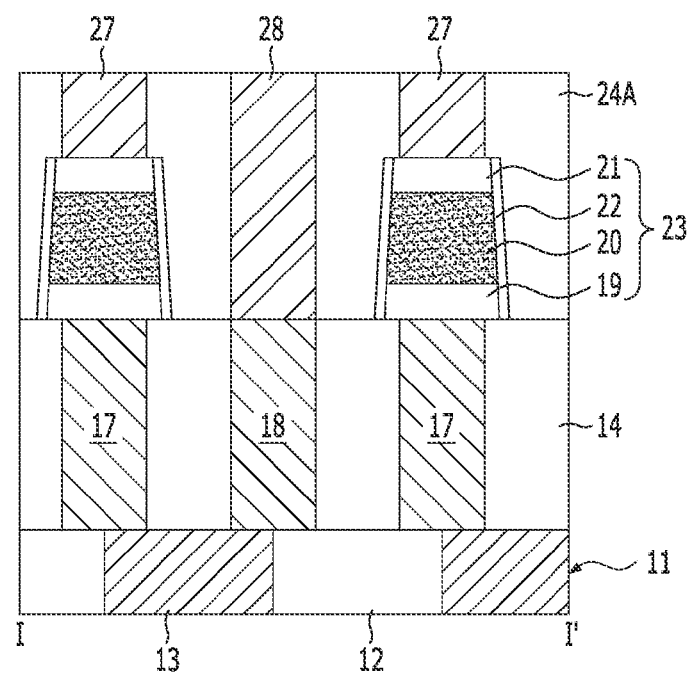

Reference numeral 24A designates the second interlayer insulating layer after being etched As shown in FIG. 5F, a conductive material is filled in the third and fourth contact holes 25 and 26 (see FIG. 4E) to form third and fourth contact plugs 27 and 28. The third and fourth contact plugs 27 and 28 can be formed through a series of processes, including forming the conductive material on the entire surface so as to gap-fill the third and fourth contact holes 15 and 16, and electrically insulating between the adjacent contact plugs. The insulation process can be performed by etching or polishing the conductive material, formed on the entire surface, using a blanket etching process (e.g., etch back process) or a chemical mechanical polishing process until the second interlayer insulating layer 24A is exposed.

As described above, the bottom contact plugs, that is, the first and second contact plugs 17 and 18, and the top contact plugs, that is, the third and fourth contact plugs 27 and 28, are formed using the same mask, and thus the misalignment between the contact plugs can be prevented. In addition, the second contact plug 18 and the fourth contact plug 28, which perform the same function, are not formed by two separate etching processes, and thus the etching height required for the formation of each contact plug can decrease, so that a process margin can be secured.

Figure 5G:
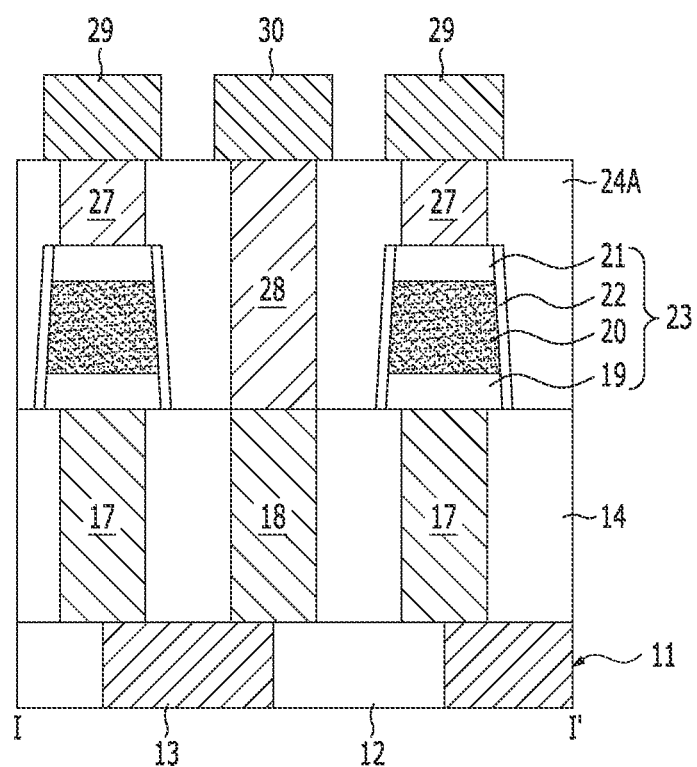

As shown in FIG. 5G, first and second conductive lines 29 and 30 are formed on the second interlayer insulating layer 24A including the third and fourth contact plugs 27 and 28.

The first and second conductive lines 29 and 30 may include a metallic layer. The metallic layer means a conductive layer including a metal element and may include a metal layer, a metal oxide layer, a metal nitride layer, metal oxynitride layer, a metal silicide layer or the like. In addition, the first and second conductive lines 29 and 40 can be formed simultaneously using the same mask, but depending on portions to which they are coupled, the first conductive lines 29 can become bit lines, and the second conductive line 30 can become source lines.

The first and second conductive lines 29 and 30 can be formed using the same mask as the line type first photoresist as shown in FIGS. 1A, 1B, 2A and 2B. As a result, the electronic device provide a sufficient process margin.

In the disclosed technology, the contact plugs that connect the substrate with the source lines are formed by two separate processes. Thus, the etching height is decreased, thereby securing a process margin.

Further, in the disclosed technology, the contact plugs that are arranged to cross each other are formed simultaneously using a single mask. Thus, the uniform spacing between the contact plugs can be easily obtained and a patterning margin can be secured.

In addition, in the disclosed technology, the bottom contact plugs and the top contact plugs are formed using the same mask, thereby solving the problem of overlap between the top and bottom contact plugs.

The above and other memory circuits or semiconductor devices based on the disclosed technology can be used in a range of devices or systems. FIGS. 6-10 provide some examples of devices or systems that can implement the memory circuits disclosed herein.

Figure 6:
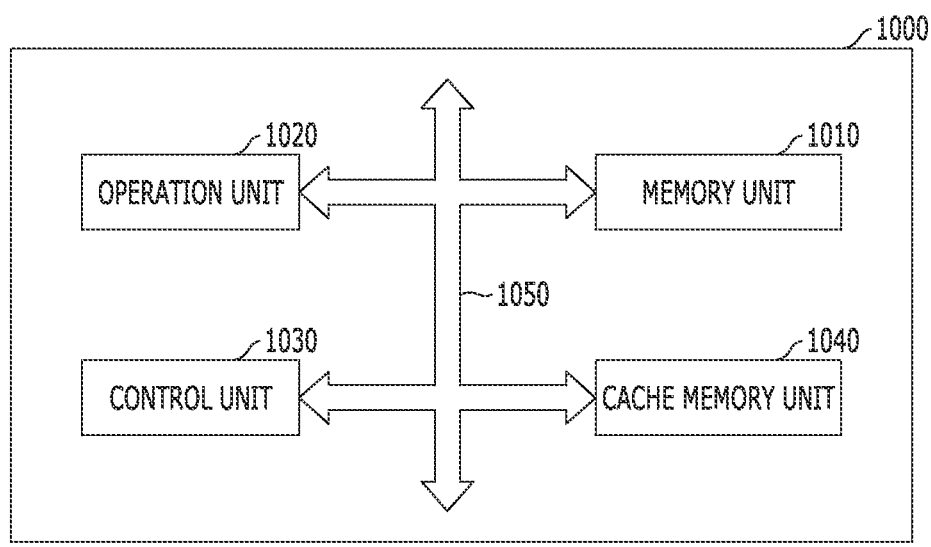
FIG. 6 is an example of configuration diagram of a microprocessor implementing memory circuitry based on the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP). The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored. The memory unit 1010 may include one or more of the above-described semiconductor devices in accordance with the implementations. For example, the memory unit 1010 may include includes a first interlayer insulating layer formed over a substrate; first and second contact plugs passing through the first interlayer insulating layer to be coupled over the substrate and alternately arranged to have a regular intervals from each other; a variable resistance element formed over the first interlayer insulating layer and coupled to the first contact plug; a second interlayer insulating layer formed over an entire structure including the first interlayer insulating layer, the variable resistance element, the first contact plug and the second contact plug; a third contact plug passing through the second interlayer insulating layer so as to be coupled to the variable resistance element, and a fourth contact plug passing through the second interlayer insulating layer so as to be coupled to the second contact plug; and conductive lines coupled to the third contact plug and the fourth contact plug, respectively. Specially, patterning margin between the contact plugs is secured and a short phenomenon between the contact plugs is prevent by simultaneously forming the first contact plug and the second contact plug, and simultaneously forming the third contact plug and the fourth contact plug. Also, different contact hole processes are performed using the same mask in order to solve a problem of misalignment between the contact plugs, thus the etching height required for the formation of each of the contact plugs can decrease, so that a process margin can be secured. Through this, operation performance of the memory unit 1010 and the microprocessor 1000 having the memory unit 1010 may be improved. As a consequence, it is possible to improve characteristic of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
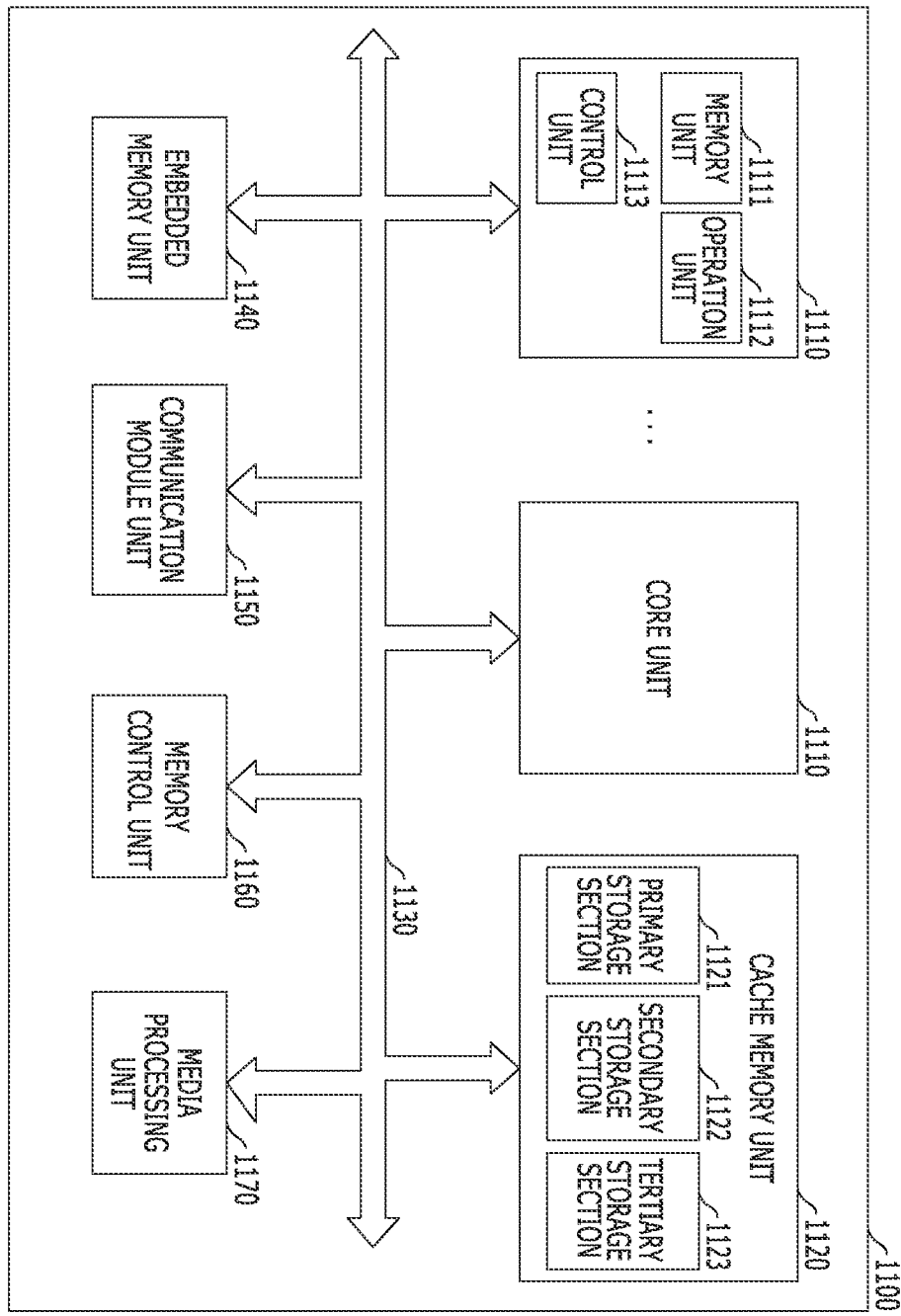
FIG. 7 is an example of configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may includes a first interlayer insulating layer formed over a substrate; first and second contact plugs passing through the first interlayer insulating layer to be coupled over the substrate and alternately arranged to have a regular intervals from each other; a variable resistance element formed over the first interlayer insulating layer and coupled to the first contact plug; a second interlayer insulating layer formed over an entire structure including the first interlayer insulating layer, the variable resistance element, the first contact plug and the second contact plug; a third contact plug passing through the second interlayer insulating layer so as to be coupled to the variable resistance element, and a fourth contact plug passing through the second interlayer insulating layer so as to be coupled to the second contact plug; and conductive lines coupled to the third contact plug and the fourth contact plug, respectively. Specially, patterning margin between the contact plugs is secured and a short phenomenon between the contact plugs is prevent by simultaneously forming the first contact plug and the second contact plug, and simultaneously forming the third contact plug and the fourth contact plug. Also, different contact hole processes are performed using the same mask in order to solve a problem of misalignment between the contact plugs, thus the etching height required for the formation of each of the contact plugs can decrease, so that a process margin can be secured. Through this, operation performance of the cache memory unit 1120 and the processor 1100 having the cache memory unit 1120 may be improved. As a consequence, it is possible to improve characteristic of the microprocessor 1000.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
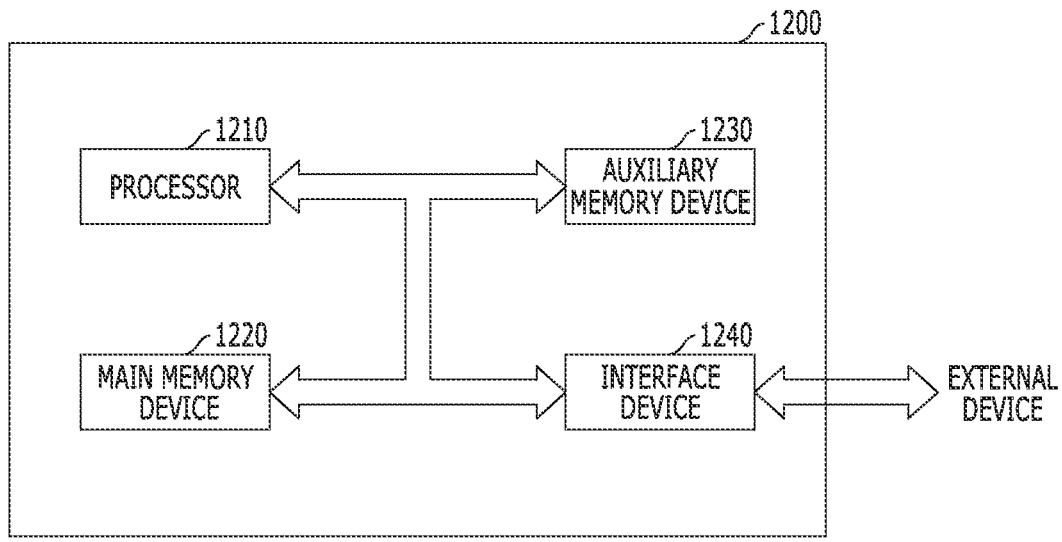
FIG. 8 is an example of configuration diagram of a system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on. The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may includes a first interlayer insulating layer formed over a substrate; first and second contact plugs passing through the first interlayer insulating layer to be coupled over the substrate and alternately arranged to have a regular intervals from each other; a variable resistance element formed over the first interlayer insulating layer and coupled to the first contact plug; a second interlayer insulating layer formed over an entire structure including the first interlayer insulating layer, the variable resistance element, the first contact plug and the second contact plug; a third contact plug passing through the second interlayer insulating layer so as to be coupled to the variable resistance element, and a fourth contact plug passing through the second interlayer insulating layer so as to be coupled to the second contact plug; and conductive lines coupled to the third contact plug and the fourth contact plug, respectively. Specially, patterning margin between the contact plugs is secured and a short phenomenon between the contact plugs is prevent by simultaneously forming the first contact plug and the second contact plug, and simultaneously forming the third contact plug and the fourth contact plug. Also, different contact hole processes are performed using the same mask in order to solve a problem of misalignment between the contact plugs, thus the etching height required for the formation of each of the contact plugs can decrease, so that a process margin can be secured. Through this, operation performance of the main memory device 1220 and the system 1200 having the main memory device 1220 may be improved. As a consequence, it is possible to improve characteristic of the microprocessor 1000.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a resistance variable element which includes a free magnetic layer, a tunnel barrier layer and a pinned magnetic layer, and a magnetic correction layer which is disposed over the resistance variable element to be separated from the resistance variable element and has a magnetization direction opposite to a magnetization direction of the pinned magnetic layer. Through this, a fabrication process of the auxiliary memory device 1230 may become easier and the reliability of the auxiliary memory device 1230 may be improved. As a consequence, a fabrication process of the system 1200 may become easier and the reliability of the system 1200 may be improved.

Also, the auxiliary memory device 1230 may further include a data storage system (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
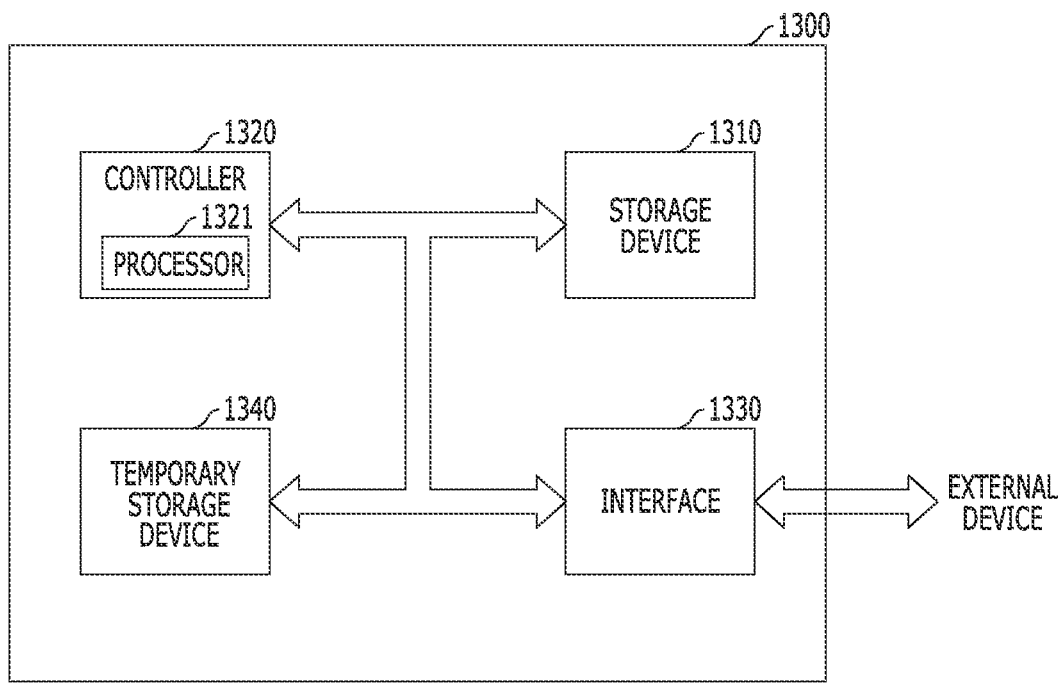
FIG. 9 is an example of configuration diagram of a data storage system implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may includes a first interlayer insulating layer formed over a substrate; first and second contact plugs passing through the first interlayer insulating layer to be coupled over the substrate and alternately arranged to have a regular intervals from each other; a variable resistance element formed over the first interlayer insulating layer and coupled to the first contact plug; a second interlayer insulating layer formed over an entire structure including the first interlayer insulating layer, the variable resistance element, the first contact plug and the second contact plug; a third contact plug passing through the second interlayer insulating layer so as to be coupled to the variable resistance element, and a fourth contact plug passing through the second interlayer insulating layer so as to be coupled to the second contact plug; and conductive lines coupled to the third contact plug and the fourth contact plug, respectively. Specially, patterning margin between the contact plugs is secured and a short phenomenon between the contact plugs is prevent by simultaneously forming the first contact plug and the second contact plug, and simultaneously forming the third contact plug and the fourth contact plug. Also, different contact hole processes are performed using the same mask in order to solve a problem of misalignment between the contact plugs, thus the etching height required for the formation of each of the contact plugs can decrease, so that a process margin can be secured. Through this, operation performance of the temporary storage device 1340 and the data storage system 1300 having the temporary storage device 1340 may be improved. As a consequence, it is possible to improve characteristic of the microprocessor 1000.

Figure 10:
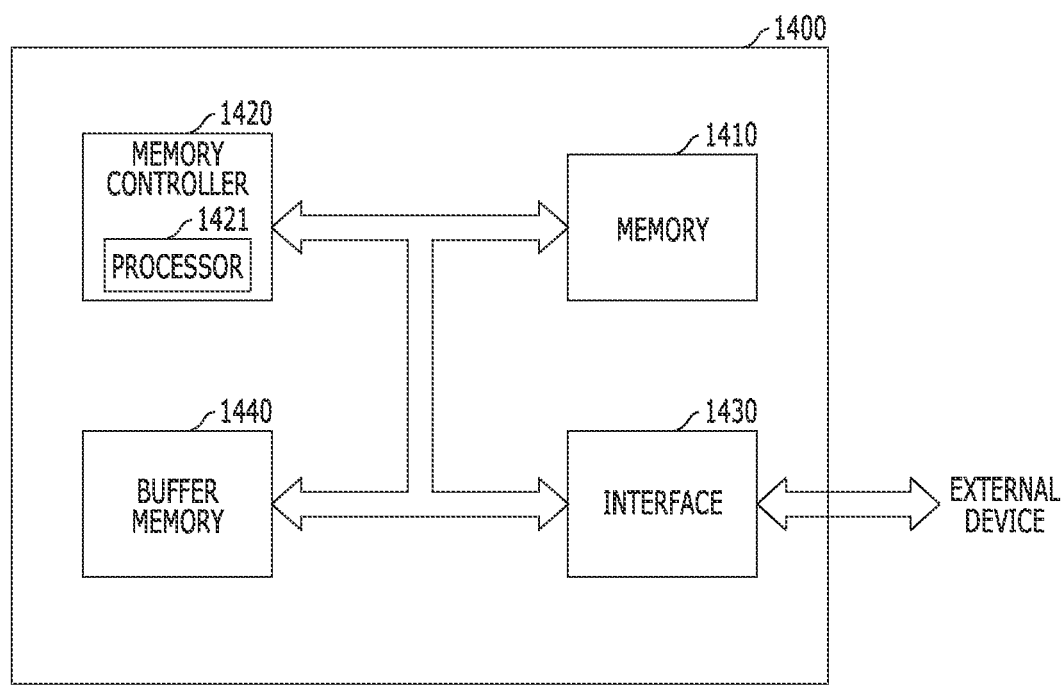
FIG. 10 is an example of configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a first interlayer insulating layer formed over a substrate; first and second contact plugs passing through the first interlayer insulating layer to be coupled over the substrate and alternately arranged to have a regular intervals from each other; a variable resistance element formed over the first interlayer insulating layer and coupled to the first contact plug; a second interlayer insulating layer formed over an entire structure including the first interlayer insulating layer, the variable resistance element, the first contact plug and the second contact plug; a third contact plug passing through the second interlayer insulating layer so as to be coupled to the variable resistance element, and a fourth contact plug passing through the second interlayer insulating layer so as to be coupled to the second contact plug; and conductive lines coupled to the third contact plug and the fourth contact plug, respectively. Specially, patterning margin between the contact plugs is secured and a short phenomenon between the contact plugs is prevent by simultaneously forming the first contact plug and the second contact plug, and simultaneously forming the third contact plug and the fourth contact plug. Also, different contact hole processes are performed using the same mask in order to solve a problem of misalignment between the contact plugs, thus the etching height required for the formation of each of the contact plugs can decrease, so that a process margin can be secured. Through this, operation performance of the memory 1410 and the memory system 1400 having the memory 1410 may be improved. As a consequence, it is possible to improve characteristic of the microprocessor 1000.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a resistance variable element which includes a free magnetic layer, a tunnel barrier layer and a pinned magnetic layer, and a magnetic correction layer which is disposed over the resistance variable element to be separated from the resistance variable element and has a magnetization direction opposite to a magnetization direction of the pinned magnetic layer. Through this, a fabrication process of the buffer memory 1440 may become easier and the reliability of the buffer memory 1440 may be improved. As a consequence, a fabrication process of the memory system 1400 may become easier and the reliability of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory unit which includes:
   a substrate;
   a first interlayer insulating layer formed over the substrate;
   first and second contact plugs passing through the first interlayer insulating layer and located over the substrate, the first and second contact plugs alternately arranged to have a regular intervals from each other;
   a variable resistance element formed over the first interlayer insulating layer and coupled to the first contact plug;
   a second interlayer insulating layer formed over an entire structure including the first interlayer insulating layer, the variable resistance element, the first contact plug and the second contact plug;
   a third contact plug passing through the second interlayer insulating layer so as to be coupled to the variable resistance element;
   a fourth contact plug passing through the second interlayer insulating layer so as to be electrically connected to the second contact plug; and
   conductive lines coupled to the third contact plug and the fourth contact plug, respectively.

2. The electronic device of claim 1, wherein the second and fourth contact plugs are arranged to overlap each other in a vertical direction.

3. The electronic device according to claim 1, further comprising a microprocessor which includes:

a control unit configured to receive a signal including a command from an outside of the microprocessor, and performs extracting, decoding of the command, or controlling input or output of a signal of the microprocessor;

an operation unit configured to perform an operation based on a result that the control unit decodes the command; and a memory unit configured to store data for performing the operation, data corresponding to a result of performing the operation, or an address of data for which the operation is performed, wherein the semiconductor memory unit is a part of the memory unit in the microprocessor.

4. The electronic device according to claim 1, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is a part of the cache memory unit in the processor.

5. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit is a part of the auxiliary memory device or the main memory device in the processing system.

6. The electronic device according to claim 1, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory unit is a part of the storage device or the temporary storage device in the data storage system.

7. The electronic device according to claim 1, further comprising a memory system which includes:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the semiconductor memory unit is a part of the memory or the buffer memory in the memory system.

8. An electronic device comprising a semiconductor memory unit which includes:

a substrate;

a first interlayer insulating layer formed over the substrate;

first and second contact plugs passing through the first interlayer insulating layer and located over the substrate, the first and second contact plugs alternately arranged to have a regular intervals from each other;

a variable resistance element formed over the first interlayer insulating layer and coupled to the first contact plug;

a second interlayer insulating layer formed over an entire structure including the first interlayer insulating layer, the variable resistance element, the first contact plug and the second contact plug;

a third contact plug passing through the second interlayer insulating layer so as to be coupled to the variable resistance element;

a fourth contact plug passing through the second interlayer insulating layer so as to be coupled to the second contact plug; and conductive lines coupled to the third contact plug and the fourth contact plug, respectively, wherein the first and third contact plugs are arranged to overlap each other in a vertical direction.

9. The electronic device of claim 8, wherein the second and fourth contact plugs are arranged to overlap each other in a vertical direction.

10. The electronic device according to claim 8, further comprising a microprocessor which includes:

a control unit configured to receive a signal including a command from an outside of the microprocessor, and performs extracting, decoding of the command, or controlling input or output of a signal of the microprocessor;

an operation unit configured to perform an operation based on a result that the control unit decodes the command; and a memory unit configured to store data for performing the operation, data corresponding to a result of performing the operation, or an address of data for which the operation is performed, wherein the semiconductor memory unit is a part of the memory unit in the microprocessor.

11. The electronic device according to claim 8, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is a part of the cache memory unit in the processor.

12. The electronic device according to claim 8, further comprising a processing system which includes:
- a processor configured to decode a command received by the processor and control an operation for information based on a result of decoding the command;
- an auxiliary memory device configured to store a program for decoding the command and the information;
- a main memory device configured to call and store the program and the information from the auxiliary memory device such that the processor can perform the operation using the program and the information when executing the program; and
- an interface device configured to perform communication between at least one of the processor, the auxiliary memory device and the main memory device and the outside,
- wherein the semiconductor memory unit is a part of the auxiliary memory device or the main memory device in the processing system.

13. The electronic device according to claim 8, further comprising a data storage system which includes:
- a storage device configured to store data and conserve stored data regardless of power supply;
- a controller configured to control input and output of data to and from the storage device according to a command inputted form an outside;
- a temporary storage device configured to temporarily store data exchanged between the storage device and the outside; and
- an interface configured to perform communication between at least one of the storage device, the controller and the temporary storage device and the outside,
- wherein the semiconductor memory unit is a part of the storage device or the temporary storage device in the data storage system.

14. The electronic device according to claim 8, further comprising a memory system which includes:
- a memory configured to store data and conserve stored data regardless of power supply;
- a memory controller configured to control input and output of data to and from the memory according to a command inputted form an outside;
- a buffer memory configured to buffer data exchanged between the memory and the outside; and
- an interface configured to perform communication between at least one of the memory, the memory controller and the buffer memory and the outside,
- wherein the semiconductor memory unit is a part of the memory or the buffer memory in the memory system.

15. A method for fabricating an electronic device, comprising:
- forming a first interlayer insulating layer over a substrate;
- simultaneously forming a first contact plug and a second contact plug, which pass through the first interlayer insulating layer to be coupled the substrate and are alternately arranged to have a regular intervals from each other;
- forming a variable resistance element over the first interlayer insulating layer which is coupled to the first contact plug;
- forming a second interlayer insulating layer over an entire structure including the first interlayer insulating layer, the variable resistance element, the first contact plug and the second contact plug;
- simultaneously forming a third contact plug and a fourth contact plug wherein the third contact plug passes through the second interlayer insulating layer so as to be coupled to the variable resistance element and the fourth contact plug passes through the second interlayer insulating layer to electrically connect to the second contact plug; and
- forming conductive lines over the second interlayer insulating layer, the conductive lines being coupled to the third contact plug and the fourth contact plug, respectively.

16. The method of claim 15, wherein the simultaneously forming of the third contact plug and the fourth contact plugs and the simultaneously forming of the first contact plug and the second contact plug are performed by using the same mask.

17. The method of claim 15, wherein the simultaneously forming of the first contact plug and the second contact plug comprises:
- forming a first negative photoresist layer on the first interlayer insulating layer;
- forming a first photoresist pattern to have a line-type patterns by patterning the first negative photoresist layer through exposure and development processes;
- forming a second negative photoresist layer on the first interlayer insulating layer and the first photoresist pattern;
- forming a second photoresist pattern to have an opened diagonal island-shaped portions by patterning the second negative photoresist layer through exposure and development processes; and
- etching the first interlayer insulating layer using hole patterns exposed by the first and second photoresist patterns.

18. The method of claim 17, wherein the forming of the first photoresist pattern comprises:
- exposing a portion of the first negative photoresist layer; and
- developing the remaining regions of the first negative photoresist layer that are not exposed to remove the remaining regions of the first negative photoresist layer,
- wherein the remaining regions developed provide a space the first and second contact plugs are to be formed.

19. The method of claim 17, wherein the forming of the second photoresist pattern comprises:
- exposing a portion of the second negative photoresist layer; and
- developing the remaining regions of the second negative photoresist layer that are not exposed to remove the remaining regions of the second negative photoresist layer;
- wherein the remaining regions developed provide a space that the third and fourth contact plugs are to be formed.

20. The method of claim 17, the forming of the second photoresist pattern comprises:
- forming the non-exposed region inclined with respect to the non-exposed region of the first negative photoresist layer to form overlapping portion with the non-exposed region of the first negative photoresist layer; and
- controlling an inclined angle such that the overlapping portions are not located in the same line in a transverse direction.

21. The method of claim 15, wherein the non-exposed region of the second negative photoresist layer include three portions overlapping with the non-exposed region of the first negative photoresist layer.

* * * * *